United States Patent
Huang et al.

(10) Patent No.: US 6,906,517 B1
(45) Date of Patent: Jun. 14, 2005

(54) METHOD AND APPARATUS FOR MAINTAINING THERMAL STABILITY OF PERMANENT MAGNETS IN MRI SYSTEMS

(75) Inventors: Xianrui Huang, Clifton Park, NY (US); Paul St. Mark Shadforth Thompson, Stephentown, NY (US); Kathleen Melanie Amm, Clifton Park, NY (US); William Daniel Barber, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/951,469

(22) Filed: Sep. 28, 2004

(51) Int. Cl.[7] .................................. G01V 3/00
(52) U.S. Cl. .................. 324/315; 324/318; 324/319; 324/320; 335/302
(58) Field of Search ................. 324/315–322; 335/302–306

(56) References Cited

U.S. PATENT DOCUMENTS

| | | | |
|---|---|---|---|
| 5,652,517 A | * 7/1997 | Maki et al. ............... 324/318 |
| 6,252,405 B1 | 6/2001 | Watkins et al. ............ 324/319 |
| 6,297,634 B1 | * 10/2001 | Aoki ........................ 324/318 |
| 6,489,873 B1 | 12/2002 | Kruip et al. ............... 335/300 |
| 6,525,537 B2 | * 2/2003 | Nerreter .................... 324/322 |
| 6,566,880 B1 | * 5/2003 | Kruip et al. ............... 324/318 |
| 6,598,404 B2 | 7/2003 | Kruip ......................... 62/3.3 |
| 6,653,835 B2 | * 11/2003 | Roeckelein et al. ........ 324/315 |
| 2002/0020174 A1 | 2/2002 | Kruip ......................... 62/3.3 |
| 2004/0064031 A1 | 4/2004 | Dean et al. ................. 600/410 |

* cited by examiner

*Primary Examiner*—Ramon M. Barrera
(74) *Attorney, Agent, or Firm*—Fletcher Yoder

(57) ABSTRACT

Briefly in accordance with one aspect, the present technique provides a method for heating a permanent magnet in a magnetic resonance imaging system. The method for heating a permanent magnet includes directly heating a surface of the permanent magnet using a surface heater. The present technique also provides a system for heating a permanent magnet in a magnetic resonance imaging system. The system includes a surface heater configured to directly heat a surface of the permanent magnet.

31 Claims, 4 Drawing Sheets

METHOD AND APPARATUS FOR MAINTAINING THERMAL STABILITY OF PERMANENT MAGNETS IN MRI SYSTEMS

BACKGROUND

The present invention relates generally to magnetic resonance imaging (MRI) systems and specifically to MRI systems using permanent magnets.

Magnetic resonance imaging (MRI) systems are widely used in medical community as a diagnostic tool for imaging the tissue and organ structures of a patient. MRI systems establish a primary magnetic field, and a series of gradient fields that influence gyro magnetic materials in the object to be imaged. During imaging, gradient fields are pulsed in accordance with predetermined imaging protocols, and a radio frequency field causes motion of molecules of the gyro magnetic materials. Signals resulting from realignment of the molecules are then detected and processed to reconstruct useful images of the object. MRI magnet designs include closed magnets and open magnets.

Closed magnets typically have a single, tubular-shaped bore in which the object may be positioned for imaging. Open magnet designs, including "C" or "U" shaped magnets, typically employ two magnet assemblies separated by a space from one another, with the space between the magnet assemblies defining an imaging volume. The object to be imaged, such as a patient, is positioned in the imaging volume for imaging. In open MRI systems, the space between the magnet assemblies aids certain patients in remaining comfortable during examinations and also allows for access by medical personnel for surgery or any other medical procedure during magnetic resonance imaging.

Image quality in MRI systems depends on the stability of the main magnetic field. In MRI systems employing permanent magnets, such as open MRI systems, the main magnetic field may fluctuate in response to temperature changes in the permanent magnet. Therefore, stability of the main magnetic field in these MRI systems depends on maintaining thermal stability of the permanent magnets. In order to maintain thermal stability, the permanent magnets are generally maintained at a set temperature, which is typically higher than the ambient room temperature. For example the permanent magnets may be maintained at a temperature of 30 degrees Celsius when the ambient room temperature is around 22 degrees Celsius.

Because electrical heaters, such as resistive heaters generate magnetic fields, which can affect the stability of the main magnetic field, it is generally infeasible to directly heat the permanent magnets of such an open system using electrical techniques. Instead, temperature control of the permanent magnets in a permanent magnet MRI system is typically achieved by controlling the temperature of the support structure, known as the yoke, which holds the permanent magnets.

Such indirect temperature control may be undesirable for a variety of reasons, however. For example, the mass of the yoke may require substantial heating to achieve the desired temperature increase in the attached permanent magnet. Furthermore, such indirect control may make precise control of the permanent magnet temperature difficult. In particular, the delay between a temperature change in the permanent magnet after heat is applied to the yoke may result in an undesirable lag time during which the main magnetic field is not stable.

Furthermore, as discussed above, MRI systems also include a gradient coil to generate the gradient field. The gradient coil is typically close to the permanent magnets in open MRI systems. During imaging, gradient currents passing through the gradient coil may increase the temperature of the permanent magnets above, resulting in additional thermal instability and, hence, main magnetic field instability. Under these circumstances, use of the resistive heaters discussed above for maintaining thermal stability is ineffective since the permanent magnet is already hotter than desired.

Thus there exists a need for an effective method and system for maintaining thermal stability of the permanent magnets in the MRI systems.

BRIEF DESCRIPTION

In accordance with one aspect of the present technique, a method for cooling a gradient coil proximate to a permanent magnet of a magnetic resonance imaging system is provided. The method includes creating an air pressure gradient between the gradient coil and the permanent magnet.

In accordance with another aspect, the present technique provides a method for heating a permanent magnet in a magnetic resonance imaging system. The method for heating a permanent magnet includes directly heating a surface of the permanent magnet using a surface heater.

In accordance with one embodiment, the present technique provides a system for cooling a gradient coil proximate to a permanent magnet in a magnetic resonance imaging system. The system for cooling a gradient coil includes an air-tube. The air-tube further includes a first end with an opening and extends from proximal to a center of the permanent magnet. The system for cooling a gradient coil also includes a vacuumizing system coupled to a second end of the air-tube and configured to create an air pressure gradient at the first end of the air-tube.

In accordance with another embodiment, the present technique provides a system for heating a permanent magnet in a magnetic resonance imaging system. The system includes a surface heater configured to directly heat a surface of the permanent magnet.

DRAWINGS

These and other features, aspects, and advantages of the present invention will become better understood when the following detailed description is read with reference to the accompanying drawings in which like characters represent like parts throughout the drawings, wherein.

Figure 3:
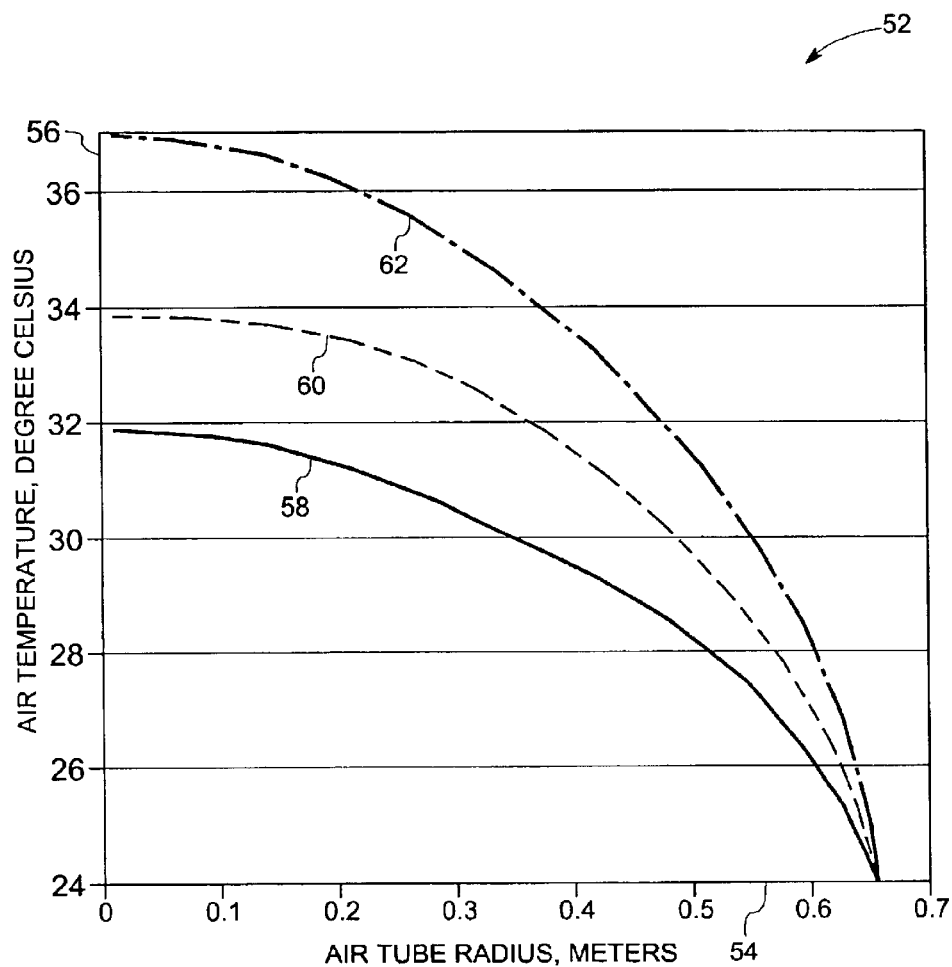
Figure 4:
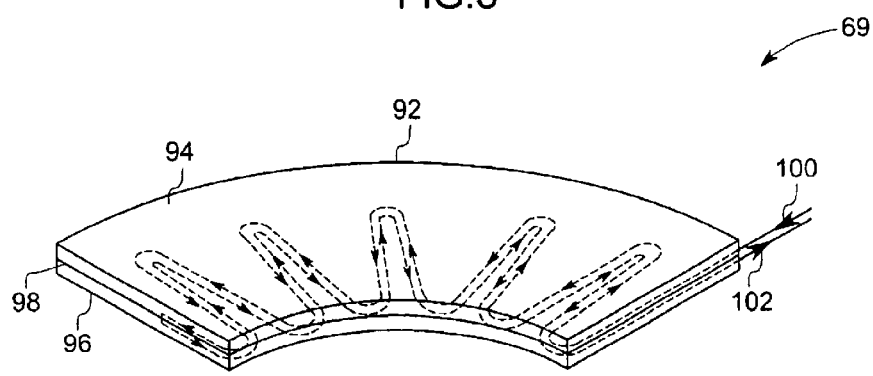
Figure 5:
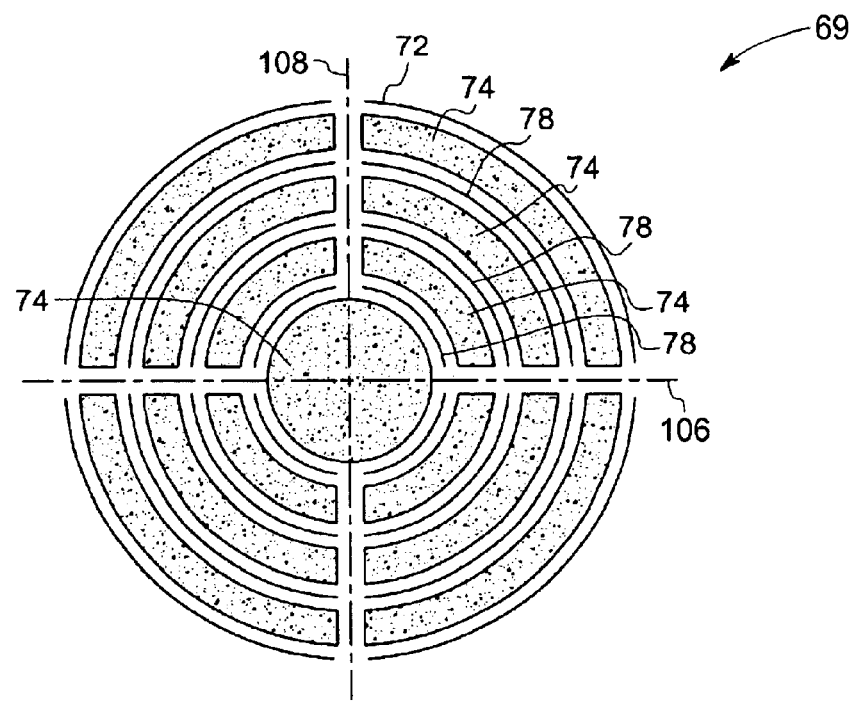
Figure 6:
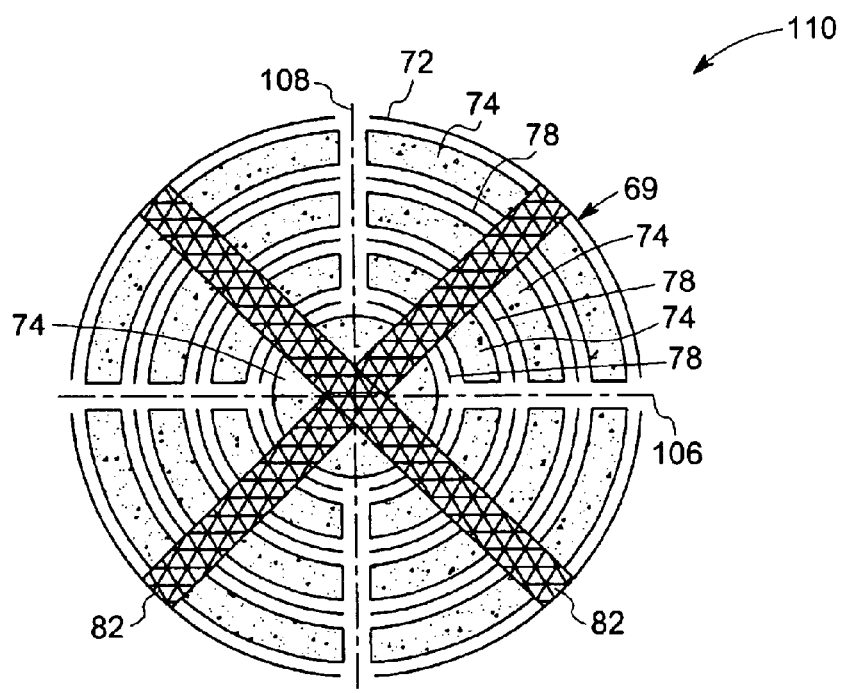

FIG. 3 graphically represents characteristics of air temperature vs. a diameter of air-tube and an airflow rate, in accordance with aspects of present technique;

FIG. 4 is a perspective view of an embodiment of a heater, in accordance with aspects of present technique;

FIG. 5 is a plan view of an embodiment of heaters, in accordance with aspects of present technique; and FIG. 6 is a plan view of another embodiment of heaters with thermal coupling, in accordance with aspects of present technique.

DETAILED DESCRIPTION

The present technique is generally directed towards method and apparatus for maintaining thermal stability of permanent magnets in MRI systems. The present technique is specifically directed to maintaining thermal stability of the permanent magnets.

Figure 1:
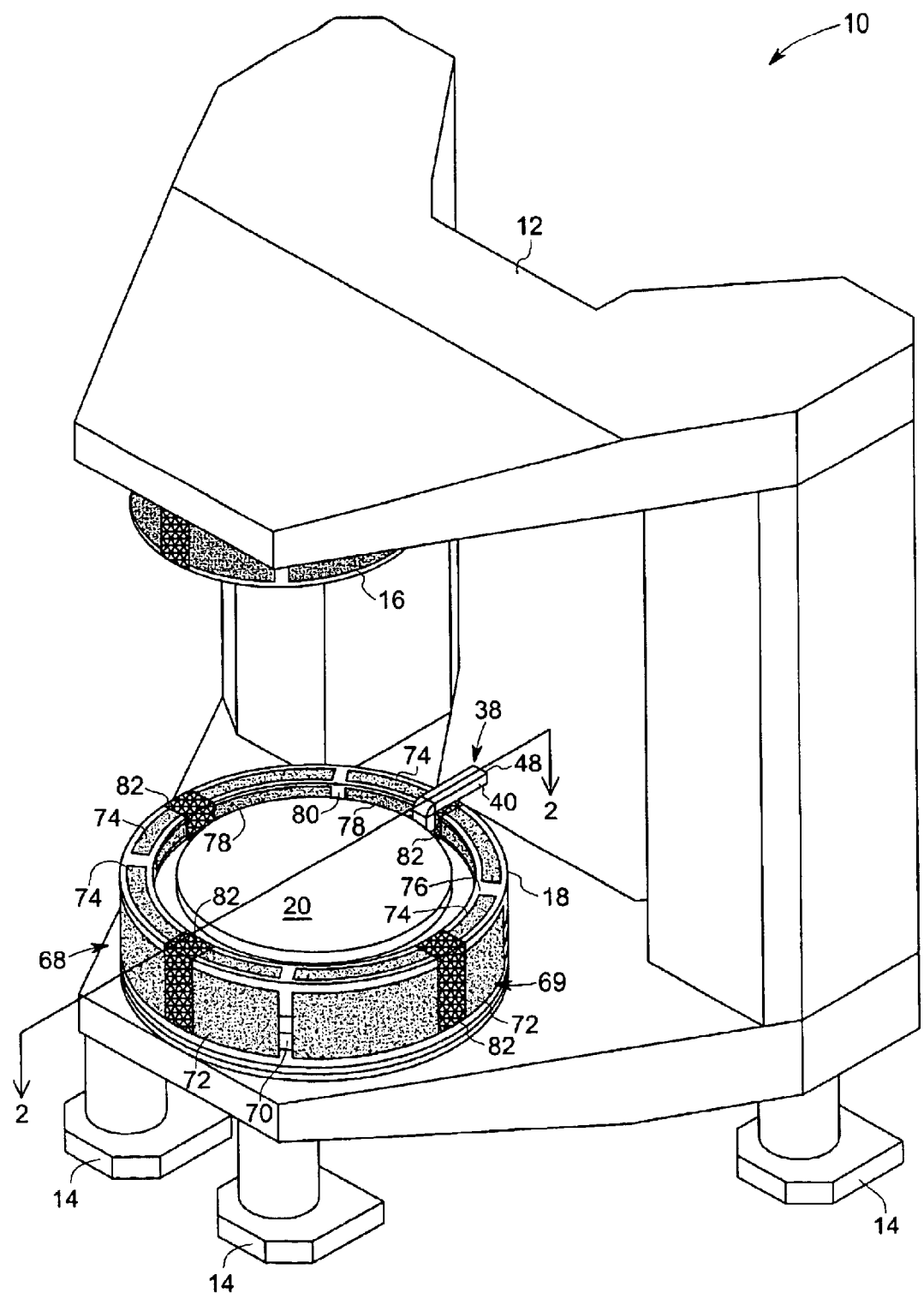
FIG. 1 is a perspective view of an embodiment of an open MRI system with a cooling system and a heating system, in accordance with aspects of present technique.

Turning now to the drawings, and referring first to FIG. 1, an embodiment of an open MRI system 10 configured to maintain thermal stability in accordance with the present technique is illustrated diagrammatically. The MRI system 10 includes a yoke 12, legs 14, a top permanent magnet 16 and a bottom permanent magnet 18. A gradient coil 20 is also present near each permanent magnet 16 and 18, as depicted with regard to the bottom permanent magnet 18 in FIG. 1.

Figure 2:
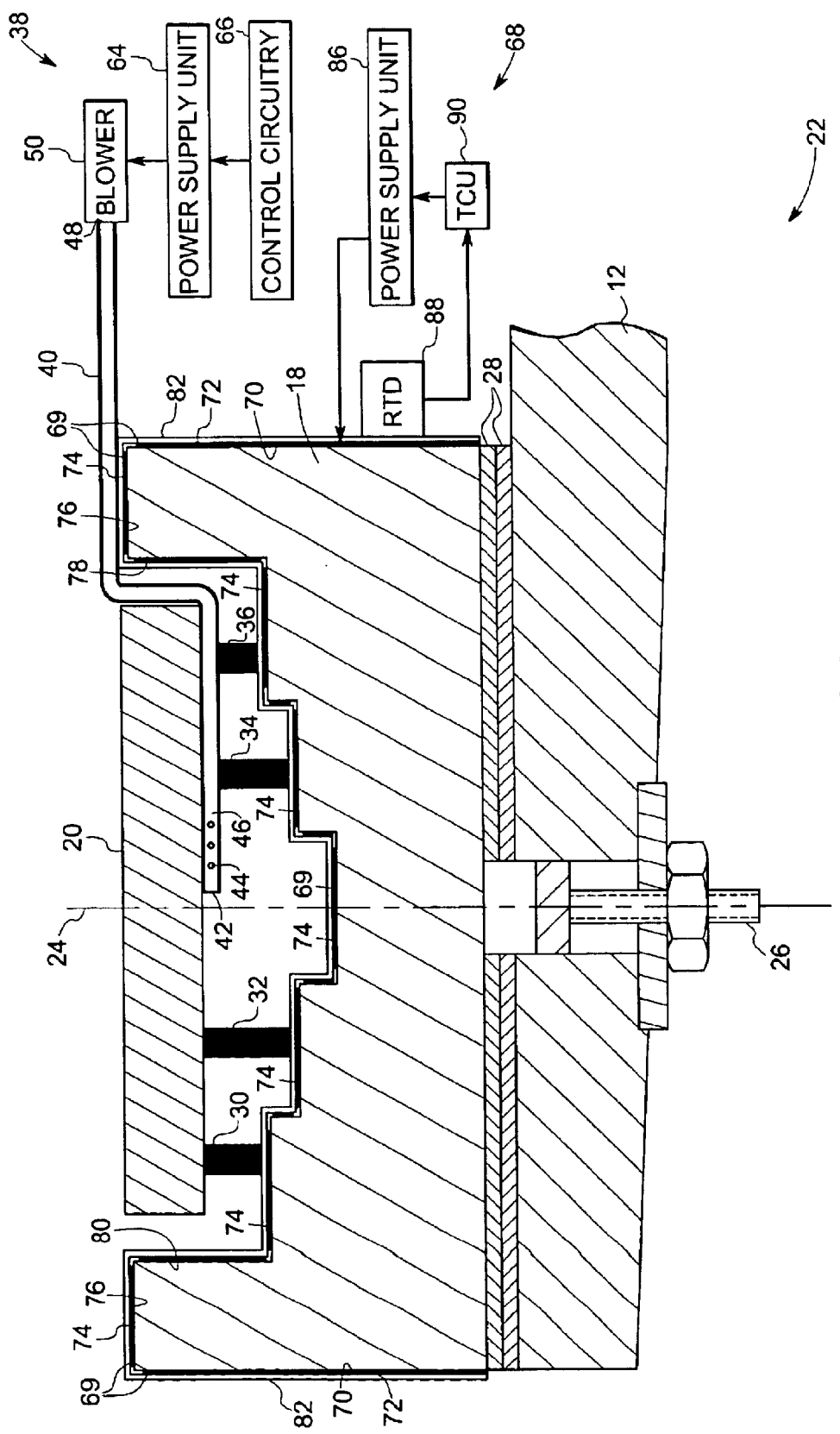
FIG. 2 is a partial cross-sectional view of a bottom permanent magnet of FIG. 1.

FIG. 2 depicts a partial cross-sectional view 22 of the bottom permanent magnet assembly 18 of FIG. 1. The yoke 12 supports the bottom permanent magnet 18. As can be seen, reference numeral 24 is an imaginary central axis and the bottom permanent magnet 18 and its surfaces are symmetric about the central axis 24. Reference numeral 26 is a permanent magnet adjustment assembly that may be used for adjusting a main magnetic field $B_0$ of the MRI system 10. Reference numeral 28 is a set of laminate layers made of soft magnetic material. Reference numerals 30, 32, 34 and 36 are shims. The shims may be made of non-permanent magnetic material, such as iron and other suitable metals and alloys. As can be seen, the gradient coil is denoted by reference numeral 20.

In accordance with one aspect of the present technique, a cooling system 38, as depicted in FIGS. 1 and 2, is provided. For the sake of simplicity, the cooling system is discussed herein with regard to the bottom permanent magnet 18 depicted in FIG. 2, however it is to be understood that the cooling system may also be employed with the top permanent magnet 16. As will be appreciated by those of ordinary skill in the art, the present discussion regarding the cooling of the gradient coil 20 near the bottom permanent magnet 18 is equally applicable to the cooling of the gradient coil near top permanent magnet 16.

Referring now to FIG. 2, the cooling system 38 includes an air-tube 40 disposed at least partially between the gradient coil 20 and the bottom permanent magnet 18. A first end 42 of the air-tube 40 is disposed between the bottom permanent magnet 18 and the gradient coil 20. As depicted, the air-tube 40 may also include holes 44 on a sidewall 46 of the air-tube. The second end 48 of the air-tube 40 extends outside the diameter of the bottom permanent magnet 18. The air-tube 40 may be made of thermally insulated material such as fiberglass, an epoxy impregnated fiberglass, plastic or ceramic to name but a few possible materials. The shape of a cross-section of the air-tube 40 may be a circle, a polygon, among others to name but a few possible shapes.

The second end 48 of the air-tube 40 may be coupled to an air pumping system, such as to an inlet or outlet of a blower 50, to create an air pressure gradient around the first end 42 of the air-tube 40. The air pressure gradient is the difference between the ambient air pressure in the environment of the MRI system 10 and the air pressure proximate to the first end 42 of the air-tube 40. The air pressure gradient may be positive, that is, the air pressure proximate to the first end 42 of the air-tube 40 may be higher than the ambient air pressure. This may be achieved by pumping air from the environment through the air-tube 40 to exit at the first end 42, such as by connecting the second end 48 of the air-tube 40 to an outlet of the blower 50. Alternatively, the air pressure gradient may be negative, that is, the air pressure proximate to the first end 42 of the air-tube 40 may be lower than the ambient air pressure. This may be achieved by sucking in air from between the bottom permanent magnet 18 and the gradient coil 20 through the first end 42 of the air-tube 40, such as by connecting the second end 48 of the air-tube 40 to an inlet of the blower 50.

Once established, the air pressure gradient causes a flow of ambient air between the bottom permanent magnet 18 and the gradient coil 20. In particular, if a high-pressure gradient is established, ambient air will flow outward from the first end 42 of the air-tube 40. Conversely, if a low-pressure gradient is established, ambient air will flow inward from the environment toward the first end 42 of the air-tube 40. Because the temperature of the ambient air is lower than the temperature of the gradient coil, the gradient coil 20 is cooled by the circulation of ambient air toward or away from the first end 42 of the air-tube 40. In one exemplary embodiment, the first end 42 of the air-tube 40 is situated near or at the center of the bottom permanent magnet 18 though in other embodiments, the first end 42 may be disposed at other locations between the bottom permanent magnet 18 and the gradient coil 20. In addition, though the present discussion has discussed a single air-tube 40 for simplicity, the cooling system 38 may include multiple air-tubes 40 in which the respective first ends 42 of each air-tube 40 are disposed between the bottom permanent magnet 18 and the gradient coil 20 (or between the top permanent magnet 16 and the gradient coil 20 with regard to the top symmetric half of the MRI system 10). Furthermore, as will be appreciated by those of ordinary skill in the art, in one embodiment, the yoke 12 may be heated or preheated to maintain a constant temperature of the bottom permanent magnet 18 (or top permanent magnet 16) when the cooling system 38 causes the circulation of ambient air between the gradient coil 20 and the respective permanent magnet.

Turning briefly to FIG. 3 a graph 52 is provided depicting air temperature as a function of air-tube diameter and airflow rate, in accordance with aspects of present technique. The X-axis 54 represents the radius, in meters, of a cross-section of an air tube. The Y-axis 56 represents air temperature in degrees Celsius. Curve 58 represents the air temperature with an airflow rate of 0.020 kilogram per second for various cross-sectional radii of the air-tube. Curve 60 represents the air temperature with an airflow rate of 0.015 kilogram per second for various cross-sectional radii of the air-tube. Similarly curve 62 represents the air temperature with an airflow rate of 0.010 kilogram per second for various cross-sectional radii of the air-tube. As will be appreciated by one of ordinary skill in the art, this and similar or related data may be used in determining the desired tube properties, such as radius, based on the amount of cooling and/or air flow desired. Thus, by selecting an optimum radius of the air-tube and maintaining a required airflow rate, the air temperature can be maintained at a level lower than the elevated constant temperature of the permanent magnet.

Referring again to FIG. 2, the cooling system 38 also includes an air pumping system. The air pumping system may include a blower 50 or a vacuum pump to name but a few systems. The blower 50 is coupled to a power supply unit 64, which may be controlled by control circuitry 66. The control circuitry 66 may activate the blower 50 during imaging operation.

The cooling system 38 discussed above addresses one aspect of maintaining thermal stability of the top permanent magnet 16, the bottom permanent magnet 18, and the gradient coil 20. In addition, maintaining thermal stability may involve heating one or both of the top permanent magnet 16 and the bottom permanent magnet 18. For example, referring once again to FIG. 1 and FIG. 2, a heating system 68 that includes magnet surface heaters 69 is provided. In one exemplary embodiment, the surface heaters 69 are bifilar heaters, as discussed below with regard to FIG. 4. In this embodiment, the surface heaters 69 are very thin layers, in the order of few millimeters thick, and may be coupled to the surfaces of either or both of the top permanent magnet 16 and the bottom permanent magnet 18.

The surface heaters 69 may include outer surface heaters 70 configured to be attached, directly or indirectly, to the outer surface 72 of a permanent magnet, such as bottom permanent magnet 18. Similarly, the surface heaters 69 may include a number of top surface heaters 74 similarly attached to the top surface 76 of the bottom permanent magnet 18. In addition, the surface heaters 69 may include a number of inner surface heaters 78 configured to be attached, directly or indirectly, to one or more of the inner surfaces 80 of a permanent magnet, such as bottom permanent magnet 18 the surface heaters 69 may be electrically connected in series or in parallel.

The surface heaters may be provided on some or all of the permanent magnet surfaces of the bottom permanent magnet 18 (or top permanent magnet 16) for directly heating the permanent magnet. In one exemplary embodiment, to maintain uniform thermal conditions of the bottom permanent magnet 18, the surface heaters are thermally linked by thermal conducting elements 82. The thermal conducting elements 82 may be thin layers, in the order of few millimeters thick, made of aluminum, austenitic stainless steel, or brass to name but few materials. The thermal conducting elements are selected and configured to minimize gradient induced eddy currents.

The surface heaters 69 are connected to a power supply unit 86. In one embodiment, a temperature sensor 88, such as a resistance temperature detector (RTD), is attached to the outer surface 70 to detect the surface temperature of the permanent magnet, such as bottom permanent magnet 18. The temperature sensor 88 is further coupled to a temperature control unit (TCU) 90, which controls the power supply unit 86. Based on the temperature detected by the temperature sensor 88, power from the power supply unit 86 is provided to the surface heaters 69 to raise the temperature of the permanent magnet to a desired temperature $T_0$, which is typically higher that the ambient (environmental) temperature. For example, if the ambient temperature is maintained at around 22 degrees Celsius, the desired surface temperature may be around 30 degrees Celsius. As described above, the TCU 90 receives temperature data from the temperature sensor 88. If the surface temperature of the bottom permanent magnet 18 is at or slightly higher than the desired magnet surface temperature $T_0$, the TCU 90 switches-off power to the surface heaters 69 by controlling the power supply unit 86. Further the TCU 90 may also switch-on the power to the surface heaters 69 when the surface temperature goes below the desired surface temperature $T_0$. To allow the surface heaters 69 to maintain a constant magnet temperature, the cooling system may be employed to ensure that the surrounding air temperature is lower than the desired magnet surface temperature $T_0$, allowing the heating system controlled by RTDs and TCUs can maintain the temperature of the bottom permanent magnet at a desired level. In one embodiment, the TCU 90 may be configured to take into account the heating of the permanent magnet by the gradient coil 20 and/or the cooling of the permanent magnet by the cooling system 38 in the operation of the surface heaters 69. For example, based upon the activity of the gradient coil 20 or the selection of a configured imaging protocol, the TCU 90 may provide power to the surface heaters 69 to prevent fluctuations in the temperature of the permanent magnets.

Referring now to FIG. 4, a perspective view of a resistive surface heater 69, in accordance with one embodiment of the present technique, is provided. In this embodiment, the surface heater 69 is a bifilar heater 92 that includes a first electrical conductive layer 94, a second electrical conductive layer 96 and an electrical insulating medium 98, such as a kapton sheet. As can be seen, the electrical insulating medium 98 is disposed between the first electrical conductive layer 94 and the second electrical conductive layer 96. The first electrical conductive layer 94 and the second electrical conductive layer 96 are electrically connected in series. An arrow 100 indicates a flow of electric current through the first electrical conductive layer 94. The electric current further flows through the second electrical conductive layer 96 as indicated by the directional arrow 102. The bifilar heater 92 generates heat due to resistance to the flow of the electric current. In this embodiment, the electric current flowing through the first electrical conductive layer 94 and the second electrical conductive layer 96 are the same in magnitude but opposite in direction. Since the direction of flow of the electric current is opposite as described above, the net magnetic field due to the flow of electric current through the surface heater is substantially zero. Thus, in this embodiment, the electric current flowing through the surface heater does not interfere with the main magnetic field $B_0$ of the MRI system 10.

Keeping FIG. 2 in mind, FIG. 5 is a plan view of a group of surface heaters 69, in accordance with one embodiment of the present technique. As can be seen, the surface heaters 69 are arranged symmetrically about an imaginary X-axis, denoted by the reference numeral 106, and an imaginary Y-axis, denoted by the reference numeral 108. The surface heaters include outer surface heaters 70, top surface heaters 74, and inner surface heaters 78, as discussed with regard to FIGS. 1 and 2.

Keeping FIG. 5 in mind, FIG. 6 is a plan view of an exemplary embodiment 110 including a group of surface heaters 69 and thermal conductive elements 82. As discussed with regard to FIG. 5, the surface heaters 69 may include outer surface heaters 70, top surface heaters 74, and inner surface heaters 78. In addition, as depicted in FIGS. 1 and 2, thermal conductive elements 82 are present in this embodiment to maintain a uniform temperature over a surface of a permanent magnet. As will be appreciated by those skilled in the art, more thermal conducting elements may be used as required to provide the uniform surface temperature of the permanent magnet. As described above, the thermal conductive elements 82 may be layers made of aluminum, austenitic stainless steel and brass.

As will be appreciated by those skilled in the art, the temperature of a permanent magnet may be maintained at a desired level by employing the some or all of the techniques described herein. Furthermore, cooling and heating systems substantially similar to those explained with respect to the bottom permanent magnet 18 may be used to maintaining the temperature of the top permanent magnet 16 in the manner described. Indeed, as will be appreciated by one of ordinary skill in the art, any discussion herein pertaining to the bottom permanent magnet 18 should be understood to be equally applicable to the top permanent magnet 16, with discussion being limited to the bottom permanent magnet 18 strictly to simplify the discussion. As will be appreciated by those of ordinary skill in the art, while the techniques disclosed herein may be used to cool either or both of the top and bottom halves of a open MRI type system, in some embodiments the temperature of the top and bottom magnets may be separately controlled to allow for natural convection cooling.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for cooling a gradient coil proximate to a permanent magnet of a magnetic resonance imaging system, the method comprising creating an air pressure gradient between the permanent magnet and the gradient coil.

2. The method of claim 1, further comprising allowing flow of ambient air between the permanent magnet and the gradient coil.

3. The method of claim 1, wherein the air pressure gradient comprises a positive air pressure gradient proximate to a center of the permanent magnet, between the permanent magnet and the gradient coil.

4. The method of claim 1, wherein the air pressure gradient comprises a negative air pressure gradient proximate to a center of the permanent magnet, between the permanent magnet and the gradient coil.

5. A system for cooling a gradient coil proximate to a permanent magnet in a magnetic resonance imaging system, the system comprising:
   an air-tube comprising a first end disposed between the permanent magnet and the gradient coil; and
   an air pumping system coupled to a second end of the air-tube, configured to create an air pressure gradient at the first end of the air-tube.

6. The system of claim 5, wherein the air-tube comprises a thermally insulated material.

7. The system of claim 6, wherein the air-tube comprises at least one of a fiberglass, an epoxy impregnated fiberglass, or a plastic or a ceramic material.

8. The system of claim 5, wherein a cross section of the air-tube comprises at least one of a circle, a polygon or combinations thereof.

9. The system of claim 5, wherein the air-tube comprises holes in a sidewall.

10. The system of claim 5, further comprising a plurality of air-tubes disposed near the permanent magnet, having the first end and the second end, wherein the second end of the plurality of air-tubes is coupled to the air pumping system.

11. The system of claim 10, further comprises a plurality of air pumping system configured to create the air pressure gradient at the first end of the plurality of air-tubes.

12. The system of claim 5, wherein the air pumping system comprises at least one of a blower, a compressor or a vacuum pump.

13. The system of claim 5, further comprises control circuitry configured to activate the system during an imaging operation.

14. A system for cooling a gradient coil proximate to a permanent magnet in a magnetic resonance imaging system, the system comprising means for creating an air pressure gradient proximate to the permanent magnet.

15. A method for heating a permanent magnet in a magnetic resonance imaging system, the method comprising directly heating a surface of the permanent magnet using a surface heater.

16. The method of claim 15, further comprising activating the surface heater in response to a temperature of the surface of the permanent magnet.

17. The method of claim 15, wherein the surface heater comprises a bifilar heater.

18. The method of claim 15, wherein the surface heater comprises a conductive element running through a first layer and a second layer, wherein the conductive element traces the same path in the first layer and the second layer.

19. The method of claim 18, further comprising routing an electric current through the first layer and the second layer of the surface heater in such a way that routing of an electric current generates substantially no magnetic field.

20. A system for heating a permanent magnet in a magnetic resonance imaging system, the system comprising a surface heater configured to directly heat a surface of the permanent magnet.

21. The system of claim 20, further comprising a temperature control unit configured to activate the surface heater in response to a temperature of the surface of the permanent magnet.

22. A system of claim 21, further comprising a temperature control unit configured to activate the surface heater in anticipation of a change in the temperature of the surface of the permanent magnet.

23. The system of claim 20, wherein the surface heater comprises:
   a first layer configured to conduct electric current; and
   a second later configured to conduct the electric current in a direction opposite to a flow of electric current in the first layer.

24. The system of claim 23, wherein the surface heater further comprises an insulating medium between the first layer and the second layer.

25. The system of claim 20, further comprising a temperature sensor configured to measure a temperature of the surface.

26. The system of claim 20, further comprising at least one additional surface heater configured to directly heat the surface of the permanent magnet.

27. The system of claim 26, wherein the surface heater and the at least one additional surface heater are coupled by a thermal conducting element.

28. The system of claim 27, wherein the thermal conducting element comprises at least one of aluminum, austenitic stainless steel or brass.

29. The system of claim 27, wherein the surface heater and the at least one additional surface heater are electrically coupled in series.

30. The system of claim 27, wherein the surface heater and the at least one additional surface heater are electrically coupled in parallel.

31. A system for heating a permanent magnet in a magnetic resonance imaging system, the system comprising means for directly heating a surface of the permanent magnet.

* * * * *